United States Patent [19]

Pavlidis et al.

[11] Patent Number: 4,827,319
[45] Date of Patent: May 2, 1989

[54] VARIABLE CAPACITY DIODE WITH HYPERABRUPT PROFILE AND PLANE STRUCTURE AND THE METHOD OF FORMING SAME

[75] Inventors: Dimitrios Pavlidis; Yves Archambault, both of Paris; Leonidas Karapuperis, Villejuif, all of France

[73] Assignee: Thomson-CSF, Paris, France

[21] Appl. No.: 178,867

[22] Filed: Apr. 4, 1988

Related U.S. Application Data

[63] Continuation of Ser. No. 946,786, Dec. 29, 1986, abandoned.

[30] Foreign Application Priority Data

Dec. 31, 1985 [FR] France .................. 85 19494

[51] Int. Cl.⁴ .................. H01L 29/92; H01L 29/48
[52] U.S. Cl. .................. 357/14; 357/15; 357/40; 357/90; 357/91
[58] Field of Search .................. 357/14, 15, 90, 91, 357/40

[56] References Cited

U.S. PATENT DOCUMENTS

| | | | |
|---|---|---|---|
| 3,636,420 | 1/1972 | Vendelin et al. | 357/14 |
| 3,706,128 | 12/1972 | Heer . | |
| 3,849,789 | 11/1974 | Cordes et al. | 357/90 |
| 4,226,648 | 10/1980 | Goodwin et al. | 357/90 |
| 4,373,166 | 2/1983 | Bergeron et al. | 357/15 |

FOREIGN PATENT DOCUMENTS

| | | | |
|---|---|---|---|
| 2374744 | 7/1978 | France . | |
| 55-29169 | 3/1980 | Japan | 357/14 |
| 56-69869 | 6/1981 | Japan | 357/14 |

OTHER PUBLICATIONS

Kannam et al, "Design Consideration of Hyperabrupt Varactor Diodes", IEEE Transactions on Electron Devices, vol. ED-18, No. 2, Feb. 1971.

*Primary Examiner*—Andrew J. James
*Assistant Examiner*—Ngan Van Ngo
*Attorney, Agent, or Firm*—Oblon, Fisher, Spivak, McClelland & Maier

[57] ABSTRACT

The invention provides a variable capacity diode with a plane structure so that it may be formed in an integrated circuit, this diode has, on the substrate, three coplanar regions. The first and second uniformly doped regions support the contact making metallizations. The transition region has a variation of doping level, low at one end and high at the other end. This variation is obtained by implantation by means of a focused ion beam, with constant energy and sweeping at increasing doses, which allows a hyperabrupt profile to be obtained. The diode is a p-n junction of Schottky contact diode.

8 Claims, 1 Drawing Sheet

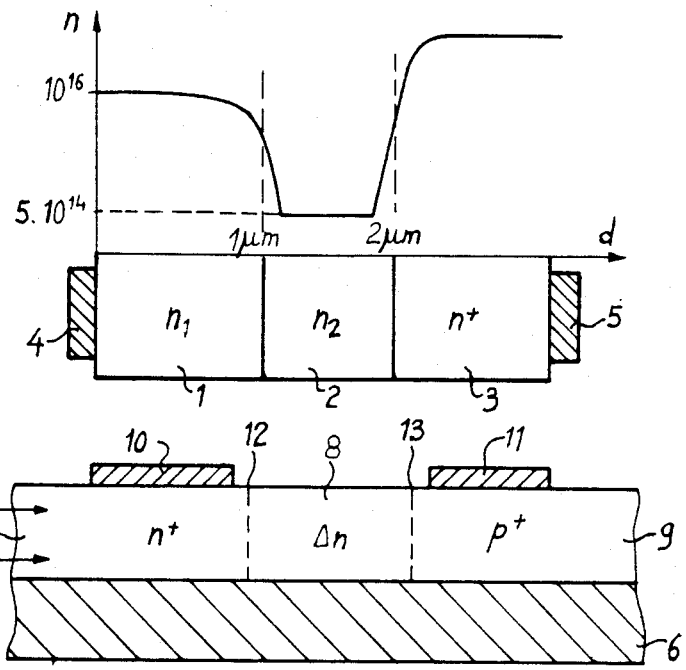
FIG_1 PRIOR ART
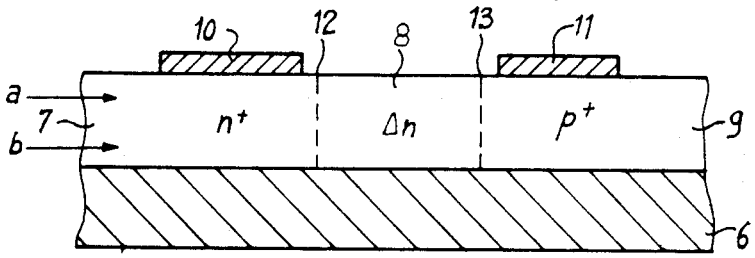
FIG_2
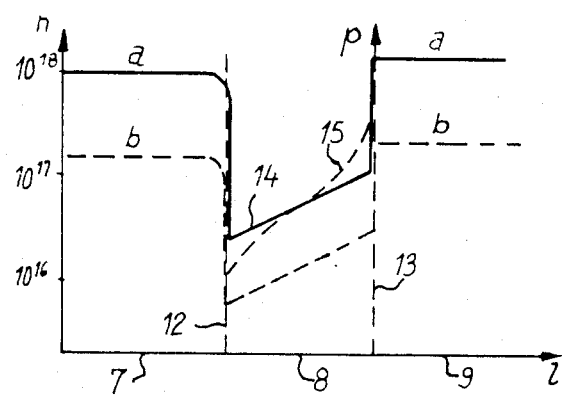
FIG_3
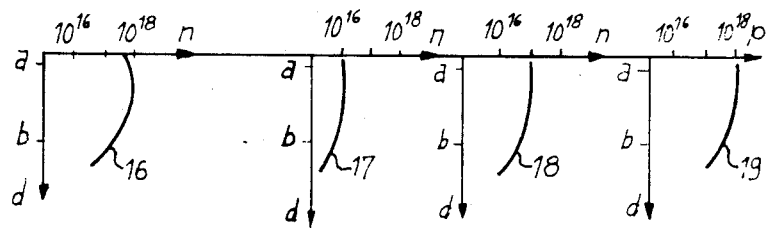
FIG_4
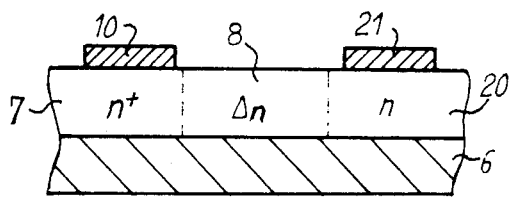
FIG_5

VARIABLE CAPACITY DIODE WITH HYPERABRUPT PROFILE AND PLANE STRUCTURE AND THE METHOD OF FORMING SAME

This application is a continuation of application Ser. No. 946,786, filed on Dec. 29, 1986, now abandoned.

BACKGROUND OF THE INVENTION

The present invention relates to a diode of plane structure with variable capacity and abrupt profile, in which the law of variation of the capacity as a function of the control voltage may be any whatsoever, since it is a consequence of the plane structure of the diode and of the profile of the doping level of the semiconductor material surface layer, this profile being obtained by an ion implantation method.

The diode of the invention may be formed not only on silicon but also on materials of the group III-IV such as GaAs. Similarly, it may be in the form of a discrete component encapsulated in a case or mounted plane with beam lead connections or an integrated component in a low frequency or ultra high frequency integrated circuit.

Known variable capacity diodes are formed by ion implantation or by epitaxy of successive layers; they have a vertical structure. But it is not possible to obtain a hyperabrupt profile by implantation in a vertical structure, because of the variations in the doping obtained by implantation. It is only possible by epitaxy, but epitaxy is not applicable in this case to integrated circuits: it is not possible to epitaxy on a semiconductor material wafer only (at the position of the variable capacity diodes and not elsewhere) at the position of the variable capacity diodes, and not elsewhere. Or else that requires a complicated and delicate technology.

SUMMARY OF THE INVENTION

In order to be able to form an integrated variable diode capacity with hyperabrupt profile, the invention consists basically in developing this profile on the surface of the wafer, in a plane structure, and not in depth, in a vertical structure. The desired doping profile is obtained by ion implantation, in a transition zone between the coplanar contact making metallizations on the same face of the semiconductor material wafer.

More precisely, the invention relates to a variable capacity diode with hyperabrupt profile and a plane structure having, supported by a semiconductor material substrate, a first heavily doped n+ access region and on which is deposited a first contact making metallization and a second heavily doped access region on which is deposited a second contact making metallization, wherein the region situated between the two access regions and coplanar therewith forms a transition region whose doping level evolves from a low value, in the vicinity of the first region, to a high value in the vicinity of the second region.

BRIEF DESCRIPTION OF THE DRAWINGS

The invention will be better understood from the following description of an example of application, with reference to the accompanying Figures which show:

FIG. 1: the doping profile of a variable capacity diode of the known art, whose structure is superimposed on the profile;

FIG. 2: a sectional view of an n-p junction diode of the invention;

FIG. 3: the doping profile of a variable capacity diode of the invention;

FIG. 4: the doping profiles of different regions of the diode of FIG. 2; and

FIG. 5: a sectional view of a Schottky diode of the invention.

Variable capacity diodes have numerous applications such as the electronic tuning of oscillators, detection, mixing or the generation of harmonics of the signals. One of their characteristics is that their capacity varies as an inverse function of the biasing voltage V which is applied thereto, in accordance with the expression:

$$C \alpha \frac{1}{(V + \phi)^k}$$

in which $\Phi$ is the height of the Schottky barrier, $k = 1/(m+2)$, the parameter defining the dopage variation n as a function of the distance d with respect to the surface in accordance with:

$$n \alpha d^m$$

The capacity of a variable capacity diode is therefore related to a parameter m, for a given bias voltage.

Different cases of distribution of the charge carriers can be distinguished:

if $m = 1$, the diode has a profile with linear slope, if $m = 0$, the diode has an abrupt profile, if $m = -1$ or $-3/2$, the diode has a hyperabrupt profile.

It is very important to be able to control the value of the parameter so as to obtain optimum operation and maximum sensitivity, with frequency response linearity.

In the known diodes, with vertical structure, the formation of a hyperabrupt profile is only possible using epitaxy methods, which are not applicable to integrated circuits for obtaining this effect.

In fact, although diodes are known having a plane structure, that is to say having complementary contact making metallizations, but having a junction in depth, it is impossible to form hyperabrupt or linear slope profiles by implantation because the parameter m depends on the gaussian distribution n(d) of the implantation used.

One example of a known vertical structure diode is shown in FIG. 1.

Two semiconductor material layers 1 and 2 are deposited and/or epitaxied on a substrate 3: layer 1 is heavily doped, to level $n_1$ and layer 2 is weakly doped to level $n_2$, the substrate 3 being for example highly doped n+ so as to ensure a low resistance to the passage of the current between the metallizations 4 and 5.

The junction $n_1/n_2$ gives the hyperabrupt characteristic to this diode. The hyperabrupt profile is shown in the upper part of the Figure: in order to have a sudden transition from a level $10^{16}$ ions.cm$^{-3}$ to a level of the order of $5.10^{14}$ ion.cm$^{-3}$, by way of example, on a few angstroms of thickness d, only the epitaxying of a layer $n_1$ on a layer $n_2$ already existing is possible. The implantation of ions would give a much more diffuse profile.

The solution provided by the invention is shown in FIGS. 2 and 3.

In FIG. 2, a variable capacity diode is developed horizontally, in a plane structure. A substrate 6, which may be semi-insulating if it is a question of a GaAs integrated circuit, supports a layer 7+8+9 of semiconducting material.

In this layer, region 7 of type n+ is heavily doped to $10^{18}$ ions.cm$^{-3}$ and supports a contact making metallization 10. Region 9 of type p+ is heavily doped to the same level $10^{18}$ ions.cm$^{-3}$ and supports a second contact making metallization 11. The diode of FIG. 2 is a p-n junction diode and the two metallizations are ohmic.

But region 8 is a transition region whose type n doping level evolves from a relatively low value in the vicinity (12) of region 7 to a relatively high value in the vicinity (13) of region 9, or the p+-n junction: this transition of the doping level is symbolized by $\Delta$n.

The curves representative of the doping levels are given in FIG. 3, in which the abscissa corresponds to the lengths $\iota$ between anode and cathode—and not to the depths d as in FIG. 1—and in which the ordinates correspond to the doping levels n or p depending on the regions of layer 7+8+9. The continuous line curve "a" gives the doping levels to a depth "a" close to the surface in FIG. 2 and the broken line curve "b" gives these levels to a depth "b" close to the substrate.

On the surface (curve "a"), the contact making regions 7 and 9 are doped to about $10^{18}$ ions.cm$^{-3}$, in a substantially constant way. The transition region 8 is inscribed between two hyperabrupt profiles 12 and 13 and its doping level may evolve in several ways. Either it evolves linearly, along the continuous straight line 14, from about $10^{15}$ ions.cm$^{-3}$ to about $10^{16}$-$10^{17}$ ions.cm$^{-3}$. Or it evolves according to any law, imposed by the projected use of the diode, and shown by the broken line curve 15.

The transition of the doping levels $\Delta$n, in the transition region 8, is readily obtained by the focalized beam ion implantation method. It is known that this method allows ions to be implanted by sweeping along strips, parallel to each other, as fine as a 1000 Å. It is therefore possible to implant in the transition region 8 by strip sweeping, with constant energy, but at increasing doses so as to increase the doping level. Because of the accuracy of this type of implantation, due to the fineness of the beam, hyperabrupt profiles can be obtained, at 12 and 13.

The construction of a diode of the invention is fairly simple. From a substrate 6, Se or Si ions are implanted so as to create a region 7, of type n+ doped to $10^{18}$ ions.cm$^{-3}$ for example. Then, without changing implantation ions, the transition region 8 is created by sweeping the beam of focused ions parallel to the future contact making metallizations. The sweep takes place of constant energy, of the order of 150 KeV, but at doses increasing from $5.10^{11}$ ions.cm$^{-2}$ to $5.10^{13}$ ions.cm$^{-2}$, so as to obtain a transition of doping level, low in the region of profile 12, high in the region of profile 13, which forms the p+-n+ junction: the implanted dose will control the law of variation of the doping level, linear or any other, in accordance with curves 14 and 15 of FIG. 3.

Finally, by implantation of Be, Zn, Zn+As ions etc... the region 9 is p+ doped.

FIG. 4 gives the different doping levels of the regions of the diode of the invention. Along a common horizontal axis of ordinates, are plotted the doping scales, n or p. The vertical axes of abscissa correspond to the implantation depths: the four curves shown are to be related to the diode of FIG. 2. Curves 16 and 19 correspond to the n+ and p+ doped contact making regions 7 and 9 respectively. Curves 17 and 18 correspond to the two ends 12 and 13 of the transition region 8.

The trend of these curves is explained by the fact that the implantation rate decreases when the distance d with respect to the implanted surface increases. This is what explains the differences of implantation levels between curves "a" and "b" of FIG. 3.

The diode of the invention may also be in the form of a Schottky diode: it is shown in FIG. 5.

In this case, the Schottky diode differs from the above described p-n junction diode in that:
 the p+ region 9 is replaced by an n region 20,
 the ohmic contact 11 is replaced by a Schottky contact 21, and
 the manufacturing process is accordingly modified, with implantation of Si or Se ions so as to create an n region 20 and deposition of metals such as Ti, Al, etc... so as to create a Schottky contact 21.

Generally, for the two types of junction or Schottky diodes, the access resistance between the ohmic contact 10 and the transition region 8 depends little on the control voltage since it is not related to the depleted zone as in conventional diodes. For a capacity of 1 pF, the access resistances of the proposed diodes are of a few tens of ohms, in contrast with the few ohms in conventional diodes.

On the other hand, with the plane structure of the diode of the invention, the current passes into the thickness of layer 7+8+9: the effective area of the p-n junction is reduced, in the direction of the thickness of this layer, to a few thousand angstroms. This then requires providing longer metal contacts, so as to restablish a sufficient junction area so as to obtain the same capacity as with a conventional diode.

This diode was designed to be constructed in integrated form, in an integrated circuit. But its structure also allows it to be manufactured in the form of a discrete component. If it is made from silicon rather than from GaAs, the doping ions are of course modified, in accordance with the technologies known to a man skilled in the art.

What is claimed is:

1. A horizontally developed variable capacity diode with hyperabrupt profile and plane structure having, supported by a semiconductor material substrate, a first heavily doped n+ access region formed directly in said substrate and on which a first contact making metallization is deposited, and a second heavily doped access region, formed directly in said substrate coplanar with said first heavily doped n+ access region, on which a second contact making metallization is deposited, wherein a region situated horizontally between the two access regions and coplanar therewith forms a transition region directly in the substrate and whose doping level evolves from a low value in the vicinity of the first region to a high value in the vicinity of the second region, said first and second heavily doped region and said transition region formed side by side in a coplanar layer in the substrate.

2. The variable capacity diode as claimed in claim 1, wherein the variation of doping level in the transition region follows a linear profile law.

3. The variable capacity diode as claimed in claim 1, wherein the variation of doping level in the transition region follows a non linear profile law.

4. The variable capacity diode as claimed in claim 1, wherein the second access region is p+ doped and the two metallizations are ohmic contact metallizations, the diode being of junction type.

5. The variable capacity diode as claimed in claim 1, wherein the second access region is n doped and the first metallization is an ohmic contact metallization and the second metallization is a Schottky contact metallization, the diode being of Schottky type.

6. The variable capacity diode as claimed in claim 1, wherein the transition region is n doped to about $10^{15}$ ions.cm$^{-3}$ at its least doped end and to about $10^{16}$–$10^{17}$ ions.cm$^{-3}$ at its most doped end.

7. The variable capacity diode as claimed in any one of the preceding claims, wherein the transition region is obtained by focused beam ion implantation, at constant energy, and sweeping with doses increasing from $5.10^{11}$ ions.cm$^{-2}$ at the least doped end to $5.10^{13}$ ions.cm$^{-2}$ at the most doped end.

8. The variable capacity diode as claimed in claim 7 concerning at least one diode integrated in an integrated circuit.

* * * * *